United States Patent
Kawasaki et al.

(10) Patent No.: US 6,664,610 B2
(45) Date of Patent: Dec. 16, 2003

(54) BIPOLAR TRANSISTOR AND THE METHOD OF MANUFACTURING THE SAME

(75) Inventors: Takeshi Kawasaki, Kanagawa (JP); Kenji Kotani, Kanagawa (JP); Masaki Yanagisawa, Kanagawa (JP); Seiji Yaegashi, Kanagawa (JP); Hiroshi Yano, Kanagawa (JP)

(73) Assignee: Sumitomo Electric Industries, Ltd., Osaka (JP)

(*) Notice: Subject to any disclaimer, the term of this patent is extended or adjusted under 35 U.S.C. 154(b) by 0 days.

(21) Appl. No.: 10/268,097

(22) Filed: Oct. 10, 2002

(65) Prior Publication Data

US 2003/0075737 A1 Apr. 24, 2003

(30) Foreign Application Priority Data

Oct. 10, 2001 (JP) ......................... 2001-313171

(51) Int. Cl.$^7$ ............................. H01L 27/082
(52) U.S. Cl. ................ 257/565; 257/197; 257/198; 257/586
(58) Field of Search ................ 257/565, 586, 257/591, 197, 198, 615

(56) References Cited

U.S. PATENT DOCUMENTS 5,834,800 A * 11/1998 Jalali-Farahani et al. ... 257/198
5,981,985 A    11/1999 Yang et al. ................. 257/198
2002/0117665 A1  8/2002 Yaegassi et al. ............ 257/47

FOREIGN PATENT DOCUMENTS

JP    06-291134    10/1994

OTHER PUBLICATIONS

Miyamoto, et al., "Evaluation of base–collector capacitance in submicron buried metal heterojunction bipolar transistors", extended abstracts of the 2002 International Conference on Solid State Devices and Materials, Nagoya, 2002, pp. 276–277.

* cited by examiner

*Primary Examiner*—Mark V. Prenty
(74) *Attorney, Agent, or Firm*—Smith, Gambrell & Russell, LLP

(57) ABSTRACT

This invention provides a new configuration and manufacturing method of the hetero-junction bipolar transistor. According to the invention, the HBT comprises a semi-insulating InP substrate, a buffer layer on the substrate, a sub-collector layer, a collector layer, a base layer, an emitter layer, and an emitter contact layer These layers are sequentially grown on the buffer layer. Since a pre-processing of forming two depressions in the sub-collector layer before growing the collector layer, the top surface of the emitter layer becomes planar surface. This results on the reduction of pits induced in the etching of the emitter contact layer, thus enhances the reliability and the high frequency performance of the HBT.

11 Claims, 11 Drawing Sheets

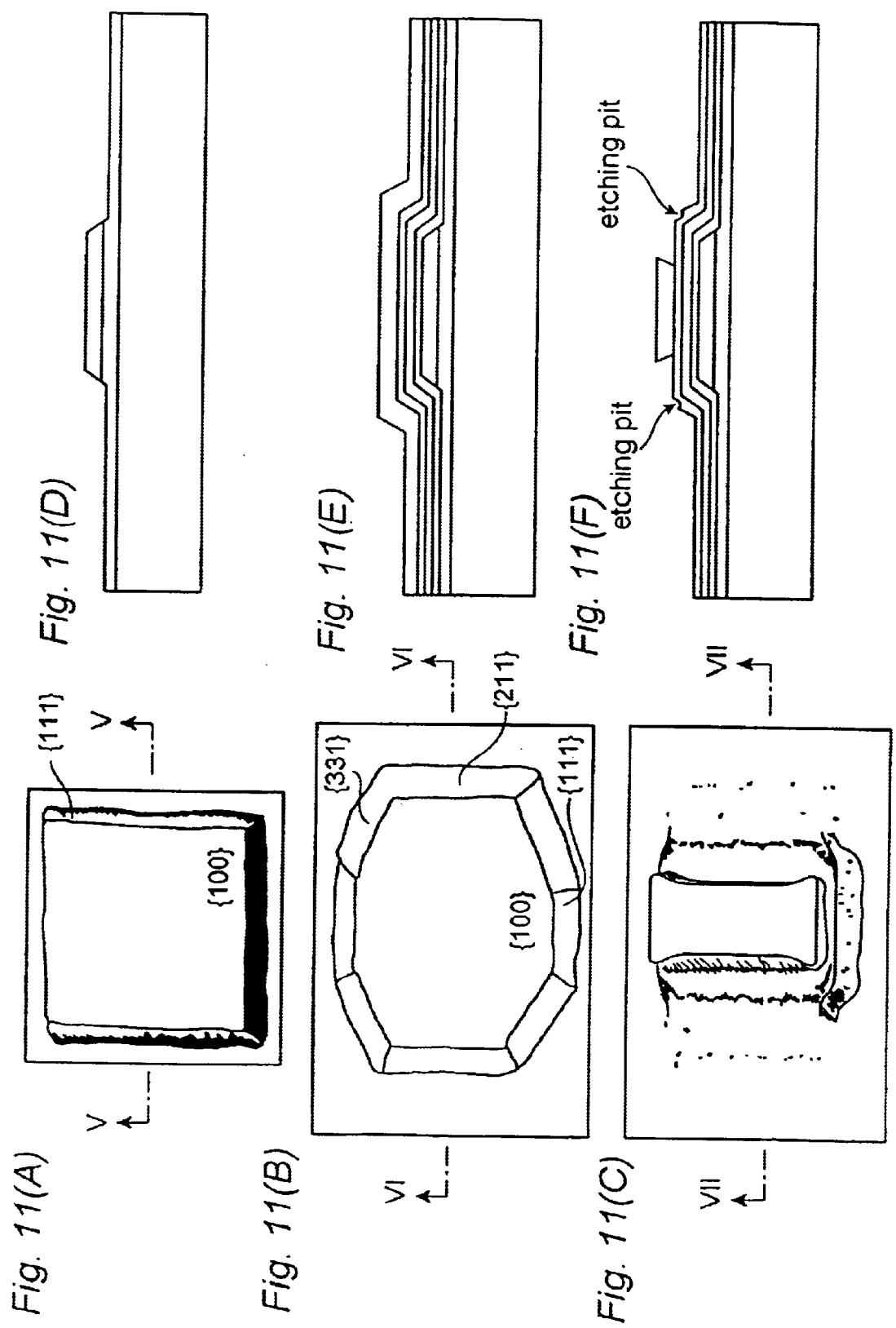

BIPOLAR TRANSISTOR AND THE METHOD OF MANUFACTURING THE SAME

BACKGROUND OF THE INVENTION

1. Filed of the Invention

This invention relates to a bipolar transistor, especially relates to a hetero-junction bipolar transistor (HBT) made of a combination of III–V compound semiconductor materials.

2. Related Prior Art

HBT is applying to an amplifier device for a high-speed optical communication system. Although HBT has intrinsically an excellent characteristic in high-frequency band over 10 GHz, further performance is requested in frequency band over 40 GHz. One solution to realize such superior performance is to reduce an area of a sub-collector layer or a collector layer to decrease the capacitance between the collector and the base electrode.

A subject accompanying with the conventional HBT and its manufacturing process is explained as referring FIG. 11. An InGaAs sub-collector is grown on an InP substrate and formed to a sub-collector mesa by an etching (FIG. 11(D)). Subsequently layer of an InGaAs collector, an InGaAs base, an InP emitter, and an InGaAs emitter contact are formed so as to cover the sub-collector mesa with an octagonal shape as shown in FIG. 11(B). Cross sections of these layers are bent upwardly and downwardly at both edges of the sub-collector mesa by reflecting the shapes thereof. Further, various crystal surfaces, such as {111}, {211} and {331}, appear in edge surfaces of the octagonal mesa.

Forming the emitter contact mesa by etching, a large number of etching-pit comes out, especially in boundaries between {211} and {100}, and also between {331} and {100}. This is due to a reason that the etching is promoted at these boundaries. Further, since the thickness of the emitter is only several tenth of nano-meter, etching-pits pierce the emitter and reach the base beneath the emitter. This fails the reliability and the yield of the HBT.

SUMMARY OF THE INVENTION

An object of the claimed invention is to provide a new configuration of the HBT and a method of producing the HBT. To solve the subject, the present HBT comprises a sub-collector layer on a predetermined surface orientation of a semiconductor substrate, a collector layer on the sub-collector layer, a base layer on the collector layer, an emitter layer on the base layer and an emitter contact layer on the emitter layer. The sub-collector layer has a pair of edges along predetermined axis of the substrate and subsequent layer of the collector, the base, and the emitter layer covers these edges of the sub-collector so as to make planar the surface of the emitter layer. Since the surface of the emitter layer is planar, the generation of etching-pits on the emitter layer can be prevented. Moreover, it is preferable that the emitter contact layer comprises two portions, one portion has a first carrier concentration and contact to the emitter layer, the other portion has a second carrier concentration greater than the first concentration and contacts to the emitter electrode. This directs the lower contact resistance, thus enhances the high frequency performance of the HBT.

Next aspect of the present HBT comprises a collector layer on a semi-insulating semiconductor substrate with a predetermined surface orientation, a base layer on the collector layer, an emitter layer on the base layer, and an emitter contact layer on the emitter layer. The collector layer forms a mesa shape with a cross section of a trapezium, and subsequently layers are formed so as to cover the collector mesa. Further, since the surface of the emitter layer is planar, the appearance of etching-pits on the emitter layer can be prevented even when edges of the emitter layer is apart from edges of the emitter contact layer. In this configuration, the thickness of the base layer at the position just above the collector layer is thinner than the thickness at the position peripheral to the collector layer. This directs the reduction of the base resistance, thus enhances the high frequency performance of the HBT.

Another aspect of the present invention relates to the method for producing the HBT having the described configuration. The method comprises steps of: 1) etching the sub-collector film deposited on the semiconductor substrate and forming a pair of depression in the sub-collector film, intrinsic region for the operation of HBT is formed therebetween. 2) Forming the collector film so as to plug depressions. 3) Forming the base film, the emitter film, and the emitter contact film on the contact film. 4) Etching the emitter contact film so as to expose portions of the emitter film both sides of the emitter contact layer. Because of the planar surface of the emitter film, etching-pits generated in the etching of the emitter contact film can be reduced. Depressions formed in the sub-collector are along a predetermined crystal axis on the substrate, and the width of the depression is prefer to be greater than 0.5 um and smaller than 2.0 um at the bottom of it. Further, it is preferable to form the contact film, the base film, the emitter film and the emitter contact film by the Metal Organized Chemical Vapor Deposition (MOCVD) technique. To use the MOCVD technique enables to plug depressions in the sub-collector film and to make a planar surface of the emitter film.

Still another aspect of the preset invention also relates to the method of the manufacturing process of the HBT. Another method comprises steps of, 1) etching the collector film deposited on the semiconductor substrate and forming a pair of depressions therein, the intrinsic region of the HBT is formed therebetween. 2) Forming the base film so as to plug depressions. 3) Forming subsequently films of the emitter film and the emitter contact film on the base film. Lastly, 4) etching the emitter contact film to make the emitter contact layer and to expose the surface of the emitter film on both sides of the emitter contact layer. The planar surface of the base layer prevents from bringing etching-pits on the emitter film. This enhances the reliability and the yield of the HBT.

The etching of the sub-collector film or the collector film is preferable to be done by a wet etching using a specific solution, which forms side edges of depressions to be normal mesa shapes and opening of the depression is wider than the bottom thereof. Therefore, plugging of depressions is facilitated, thus the planar surface of subsequently grown film can be obtained.

BRIEF DESCRIPTION OF DRAWINGS

FIG. 11(A) is a view showing a sub-collector layer forming by no depressions, FIG. 11(B) shows a mesa forming on the sub-collector layer in FIG. 11(A), FIG. 11(C) shows an emitter layer on an emitter contact layer after the etching of the emitter contact layer, FIG. 11(D) is a cross sectional view along V—V in FIG. 11(A), FIG. 11(E) is a cross sectional view along VI—VI in FIG. 11(B), and FIG. 11(F) is a cross sectional view along VII—VII in FIG. 11(C).

DETAILED DESCRIPTION OF THE INVENTION

Detailed description of the present invention will be described referring to the accompanying drawings. Constituents identical to each other or those having functions identical will be referred to with numerals of letters identical to each other without repeating over lapping explanations. In drawings, thickness of respective epitaxial layers does not reflect their real thickness. Axes shown in figures will involve their crystal graphical equivalence.

First Embodiment

Figure 1A:
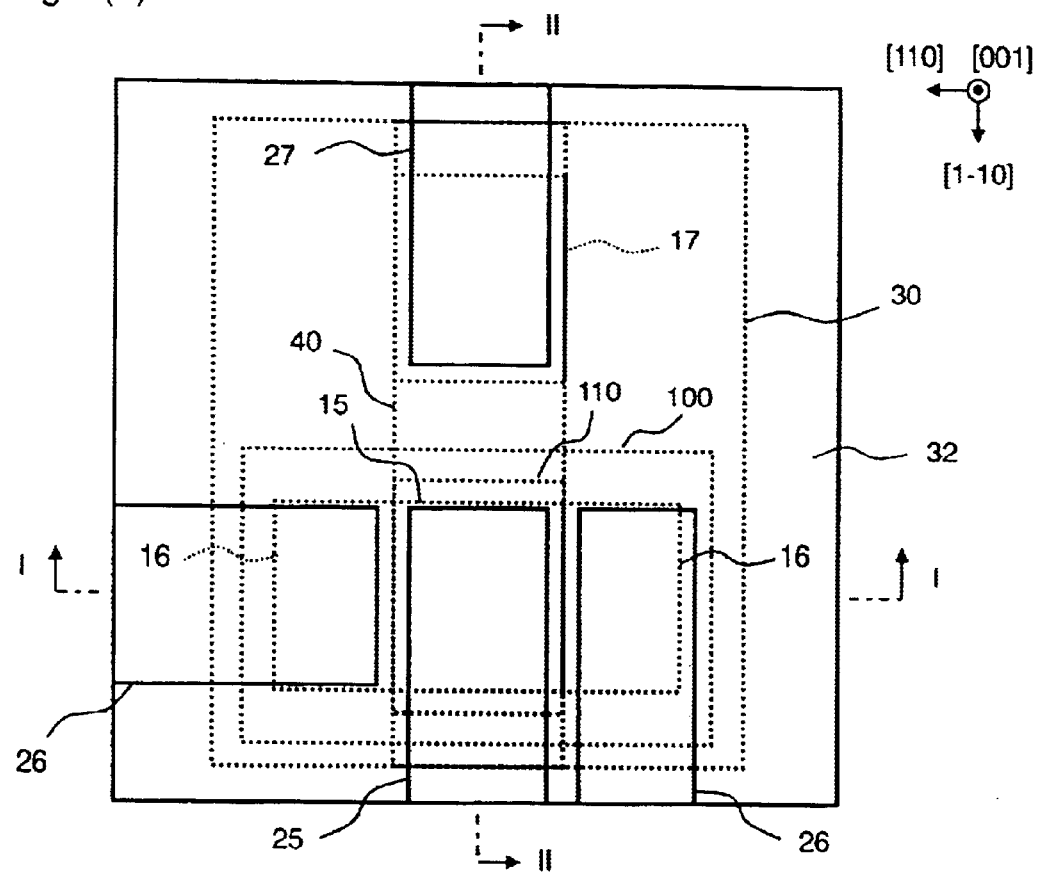
FIG. 1(A) is a plane view of the first embodiment of the present invention.
Figure 1B:
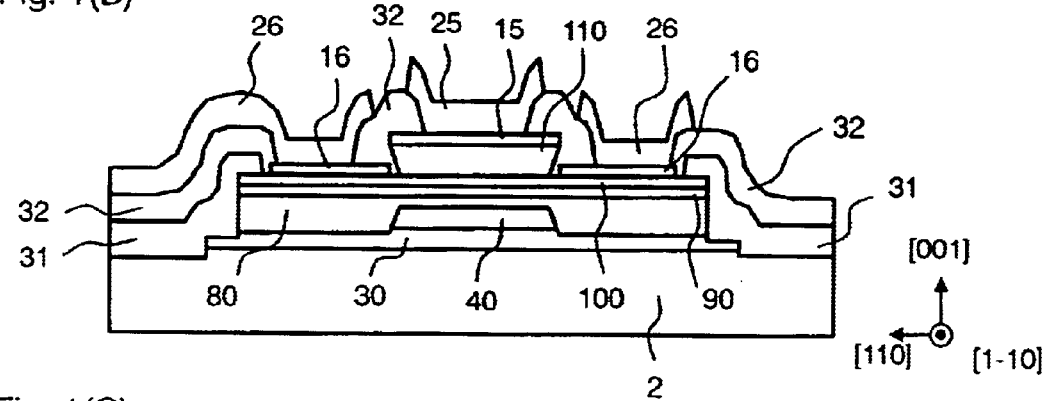
FIG. 1(B) is a cross sectional view along I—I in FIG. 1(A)
Figure 1C:
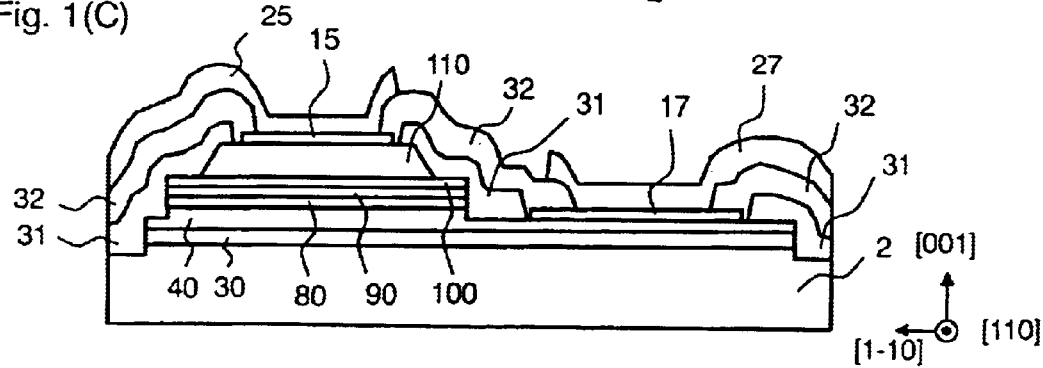
FIG. 1(C) is a cross sectional view along II—II in FIG. 1(A)

FIG. 1(A) shows a plane view of the HBT according to the first embodiment, FIG. 1(B) is a cross sectional view along I—I line in FIG. 1(A) and FIG. 1(C) is also a cross section view along II—II line in FIG. 1(A). The HBT 1 has a semi-insulating substrate 2, a buffer layer, a sub-collector layer 40, a collector layer 80, a base layer 90, an emitter layer 100, and an emitter contact layer 110.

The buffer layer 30 comprises an un-doped InGaAs with a thickness around 300 nm. The sub-collector layer 40 is formed by an n-type InGaAs with a thickness around 300 nm. The sub-collector layer is highly doped with Si, the electron concentration of the sub-collector is preferable from 0.5 to $2.0 \times 10^{19}$ cm$^{-3}$. This layer forms a mesa structure as shown in FIG. 1(B) and FIG. 1(C) with one edge is along [1–10] while the other edge is along [110]. The edge along [1–10] shows an inverse trapezium, while the edge along [110] shows a normal trapezium.

The collector layer 80 is un-dope InGaAs formed so as to cover the sub-collector layer 40 along [110], as shown in FIG. 1(B); thus the width of the collector layer 80 is wider than the sub-collector layer. The top surface of the collector layer is flat. The thickness of the layer 80 is about 400 nm on the sub-collector layer 40 and about 800 nm on the buffer layer.

The base layer 90 is p-type InGaAs with a thickness around 50 nm. The plane shape of the base layer 90 corresponds to that of the collector layer 80. The base layer 90 is highly doped with Zn, hole concentration of this layer is $(1.0–3.0) \times 10^{19}$ [cm$^{-3}$]. Carbon (C) may be used for p-type dopant substitute for Zn.

The emitter layer 100 is n-type InP with a thickness around 10 nm. The top surface of the layer 100 is almost flat. The plane shape of the emitter layer 100 corresponds to that of the base layer 90 and the collector layer 100 so that the width along [110] of the emitter layer 100 is greater than that of the sub-collector layer 40. This layer is doped with Si, the electron concentration of the layer is about $4.0 \times 10^{18}$ [cm$^{-3}$]. The thickness of the layer 100 is preferable to be greater than 5 nm and thinner than 20 nm. When the thickness is below 5 nm, the device would not show a transistor operation. On the other hand, the case that the thickness over 20 nm results on the decrease of the current multiplication coefficient.

The emitter contact layer 110 is an n-type InGaAs with a thickness around 250 nm. The cross sectional shape along [110] of the emitter contact layer shows the reverse trapezium, while it shows the normal trapezium along [1–10]. The edge along [1–10] of the emitter contact layer is apart from the edge of the emitter layer 100. This layer comprises two portions based on the electron concentration, one is within 50 nm from the interface to the emitter layer 100 with the electron concentration is around $5.0 \times 10^{18}$ [cm$^{-3}$], the other is above the former layer with the electron concentration around $2.0 \times 10^{19}$ [cm$^{-3}$]. Greater electron concentration of the latter layer enables to form a superior ohmic contact between the emitter contact layer 110 and an emitter electrode 15 described below.

The HBT 1 has the emitter electrode 15 on the emitter contact layer 110, a base electrode 16 on the emitter layer 100, and a collector electrode 17 on the sub-collector layer 40. These electrodes are made of composite metal of titanium (Ti), Platinum (Pt), and Gold (Au) sequentially formed in this order. A emitter wiring 25 is formed on the emitter electrode 15, a base wiring 26 is on the base electrode 16, and a collector wiring 27 is on the collector electrode 17. These wiring are typically made of aluminum (Al). The HBT 1 has silicon nitride (Si$_3$N$_4$, hereinafter denoted by SiN) films (31, 32) for insulating respective electrodes and for passivating the HBT 1.

Next is an operation of the HBT 1. When the device is operated in the grounded-emitter connection, carriers flow from the emitter to the collector through the following path. Electrons are injected from the base electrode to the base layer 90 through the emitter layer 100 as minority carriers by the forward biasing between the base electrode and the emitter electrode. Injected carriers into the baser layer 90 flow in the base layer, through the emitter layer 100 and arrive to the emitter electrode. The current from the collector to the emitter flows from the collector electrode 17, the sub-collector layer 40, the collector layer 40, the base layer 90, the emitter layer 100, the emitter contact layer 110, and finally arrives to the emitter electrode 15. The portion of the collector layer through which the current passes contributes the current multiplication. Namely, the sub-collector layer 40 defines the intrinsic collector. Similarly, although the emitter layer extends to both sides of the emitter contact layer and overlaps with the base layer, the emitter contact layer defines the intrinsic emitter.

The advantage of the HBT shown in FIG. 1 is that the top surface of the collector layer 80, the base layer 90, and the emitter layer 100 are almost flat in spite of that these layers are formed on the sub-collector layer with an island shape. When these layer bend tracing the shape of the sub-collector layer 40, numerous etching pits may occur at bending portions of respective layer, thus decreasing the yield of the device. In the present HBT 1, since top surfaces of these layers are formed almost flat, it prevents the generation of etching pits, which results in the improvement of the performance and the yield of the HBT.

Further advantage of the present HBT is that the base layer 90 is fully covered by the emitter layer 100. When the surface of the base layer 90 is exposed, numerous surface states may be introduced at the manufacturing process such as immersing in a chemical solvent and etching in a reactive gaseous. On the other hand, since the base layer 90 is fully protected by the emitter layer 100 of the present HBT, the leak current due the surface states decreases. Moreover, since the emitter layer 100 can be grown continuously to the base layer 90 in a reactor chamber, it further decreases the surface states in the base layer 90.

The SiN film deposited on the emitter layer 100 made of InP shows superior protective characteristics compared with that on the InGaAs layer. This is due to the fact that the SiN on InP layer shows smaller interface states on the surface of InP than that on the surface of InGaAs. Therefore, the emitter layer 100 covered by the SiN film also decreases the base leak current.

Another advantage of the present HBT 1 is the improvement of the high frequency performance due to the decrease of the base-collector capacitance. The area of the highly doped sub-collector layer 40 defines the base-collector capacitance. In the present HBT 1, since the sub-collector layer is fully covered by the moderately doped collector layer 80 and the are of the sub-collector layer 40 is smaller than the collector layer 80, the base-collector capacitance decreases which enables to enhance the high frequency performance of the HBT. Moreover, since the thickness of the base layer 90 is thinned to about 50 nm, this also decreases the base-collector capacitance.

Next is a manufacturing process of the present HBT referring from FIG. 2 to FIG. 9 that show the configuration at respective process steps. In respective figures, the drawing A shows a plane view, the drawing B shows the cross sectional view along I—I line, and the drawing C shows the cross sectional view along II—II line.

In the process, the Metal Organized Chemical Vapor Deposition (MOCVD) technique is applicable to grow respective semiconductor films using various types of source materials, such as Triethyl Gallium (TEGa), Trimethyl Indium (TMIn), Arsine ($AsH_3$), and Phosphine ($PH_3$). To adjust the conduction type and the carrier concentration, silane ($SiH_4$) and diethyl zinc (DEZn) are used for the n-type doping source and p-type doping source, respectively. Tetrachloromethane ($CCl_4$) is substitutable for the diethyl zinc as a dopant for p-conductive type. By supply these source materials into the reaction chamber, desired semiconductor films with the composition and the carrier concentration could be obtained. Temperatures from 600° C. to 750° C. are prefer for respective semiconductor films to take the crystal quality into account.

First Epitaxial Growth

Figure 2A:
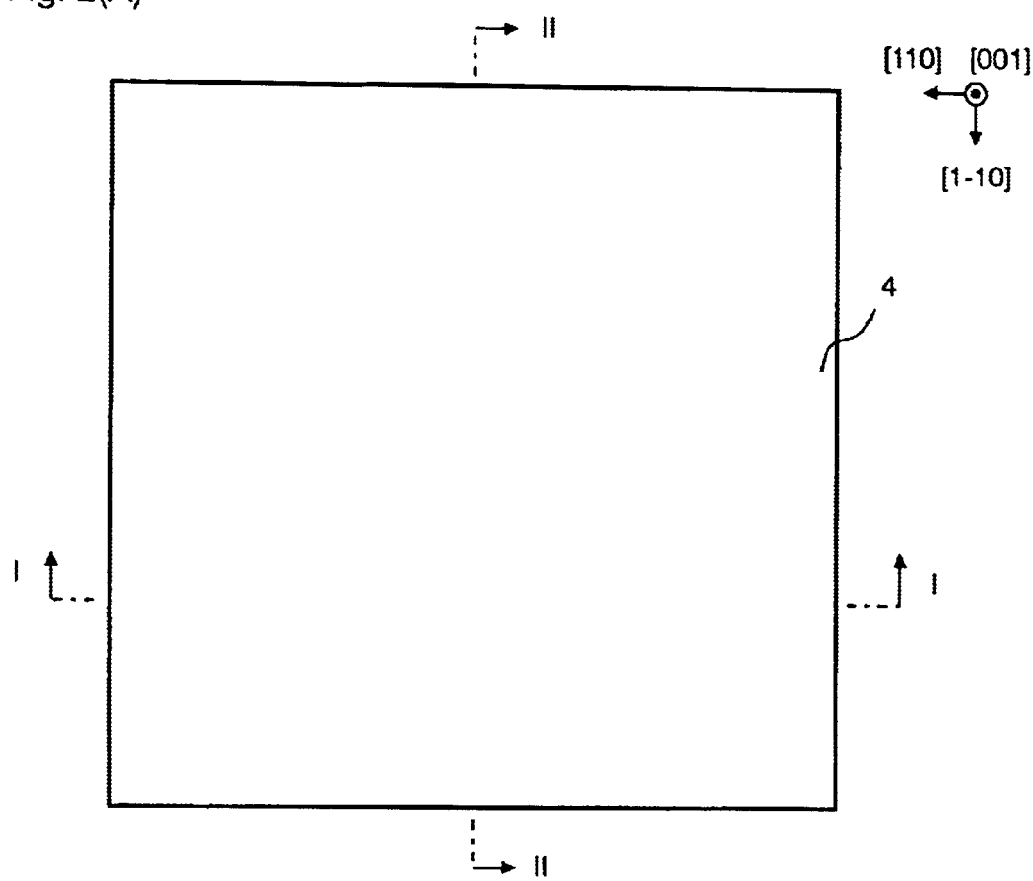
FIG. 2(A) is a plane view showing the first embodiment of the HBT at an intermediate step of the process.
Figure 2B:
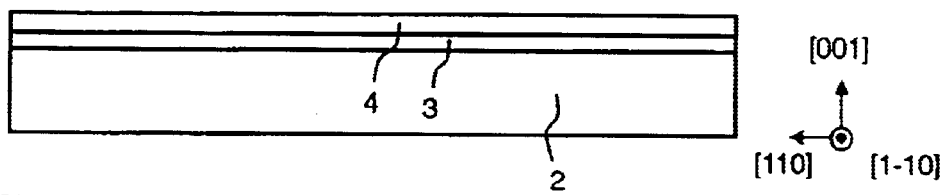
FIG. 2(B) is a cross sectional view along I—I in FIG. 2(A) and FIG. 2(C) is a cross sectional view along II—II in FIG. 2(A)
Figure 2C:
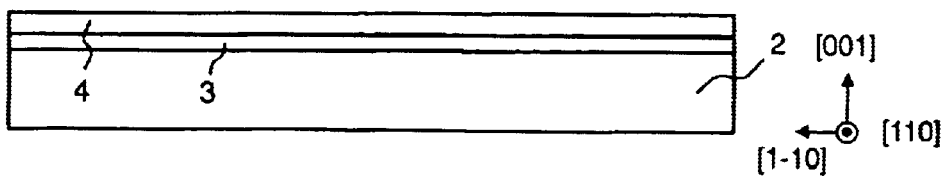

The buffer film 3 and the sub-collector film 4 are grown on the (001) surface of the semi-insulating InP substrate 2 by the MOCVD method (FIG. 2(A)~FIG. 2(C)). The buffer film 3 is made of un-dope InGaAs with 300 nm thickness. The sub-collector film 4 is an n-type InGaAs with 300 nm thickness. This film 4 contains Si as n-type dopant with the concentration of $1.0\times10^{19}$ [$cm^{-3}$].

Formation of the Sub-Collector Layer

Figure 3A:
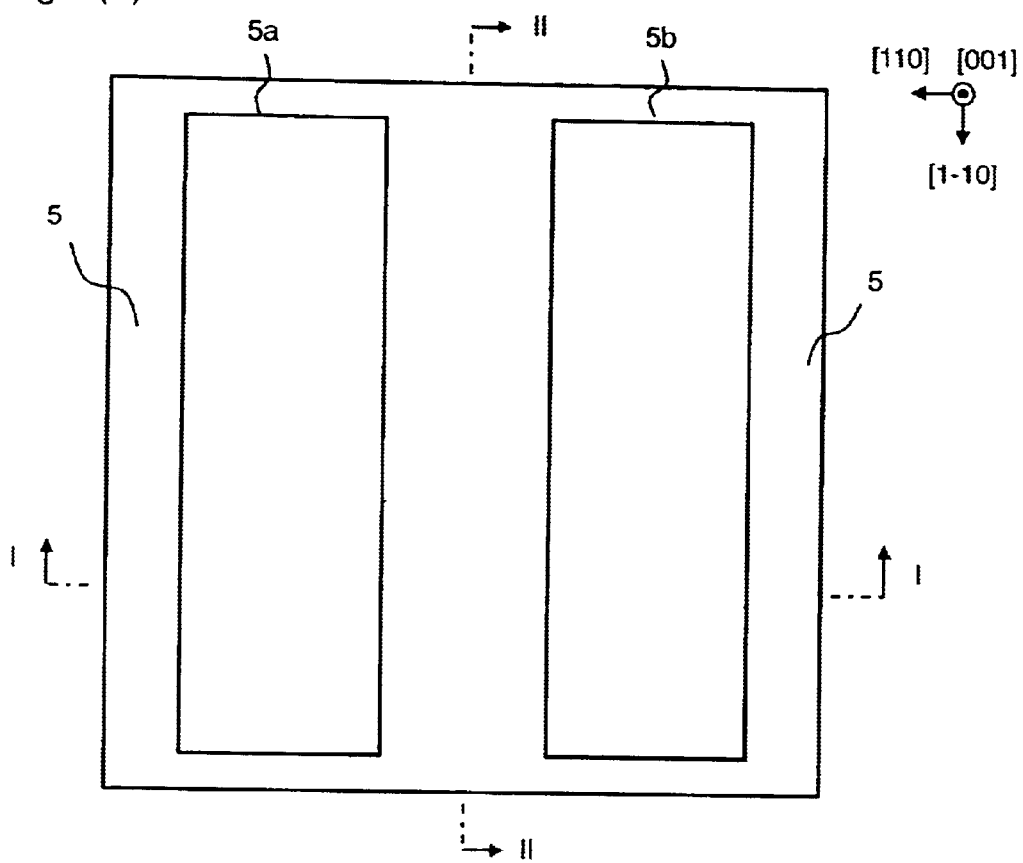
FIG. 3(A) shows a plane view of the HBT at an intermediate step subsequent to FIG. 2.
Figure 3B:
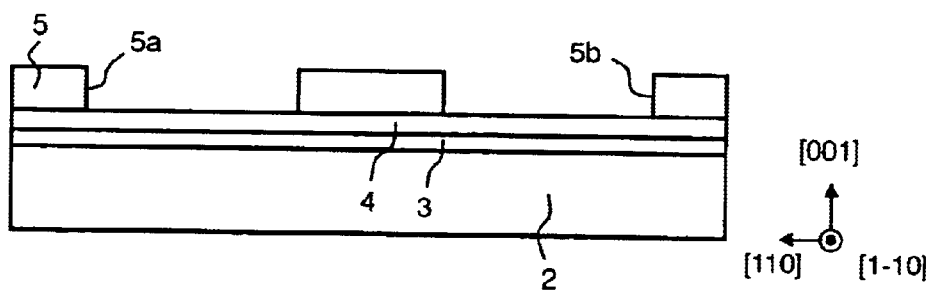
FIG. 3(B) is a cross sectional view along I—I in FIG. 3(A)
Figure 3C:
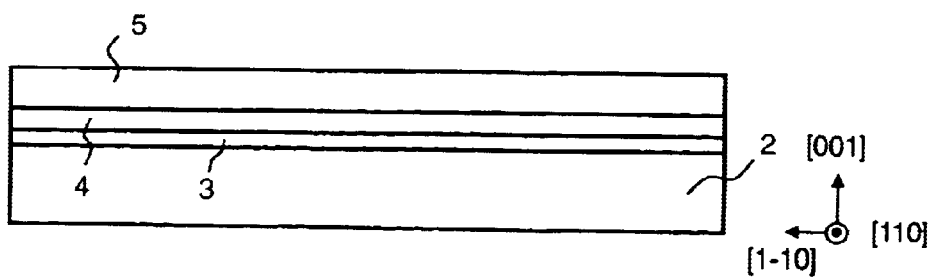
FIG. 3(C) is a cross sectional view along II—II in FIG. 3(A)
Figure 4A:
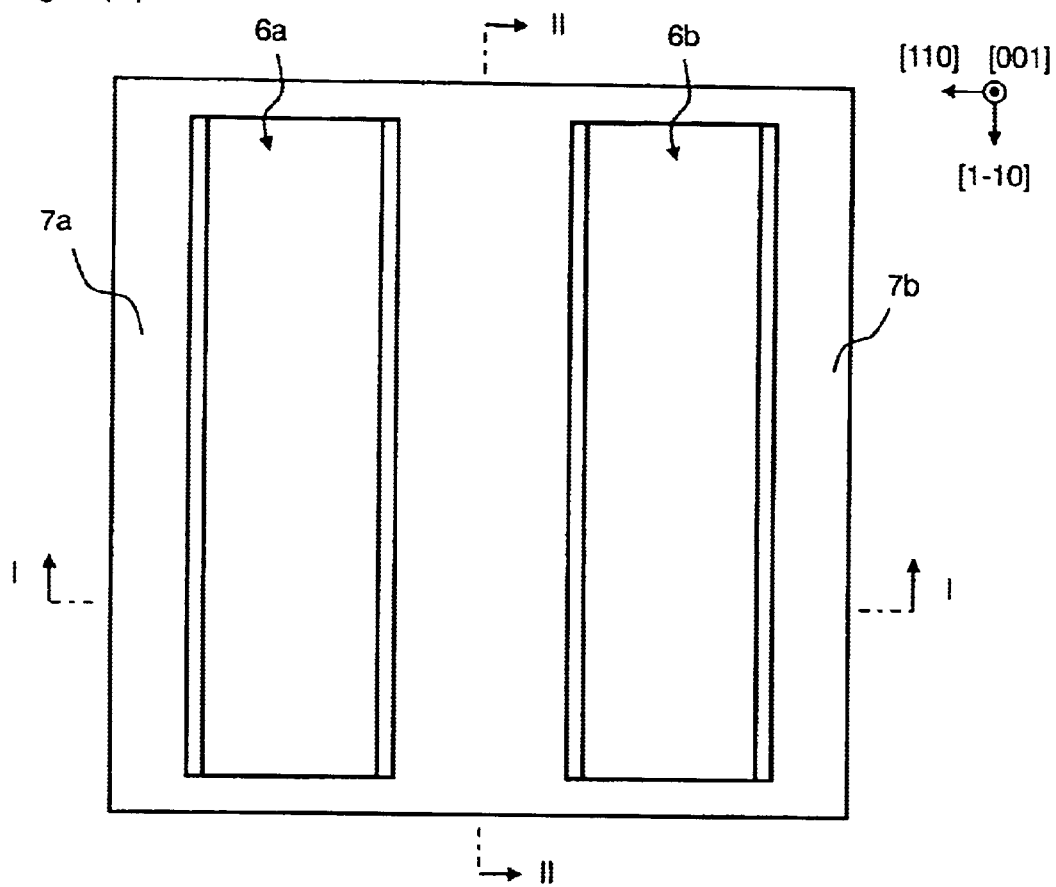
FIG. 4(A) is a plane view of the HBT at an intermediate step next to FIG. 3.
Figure 4B:
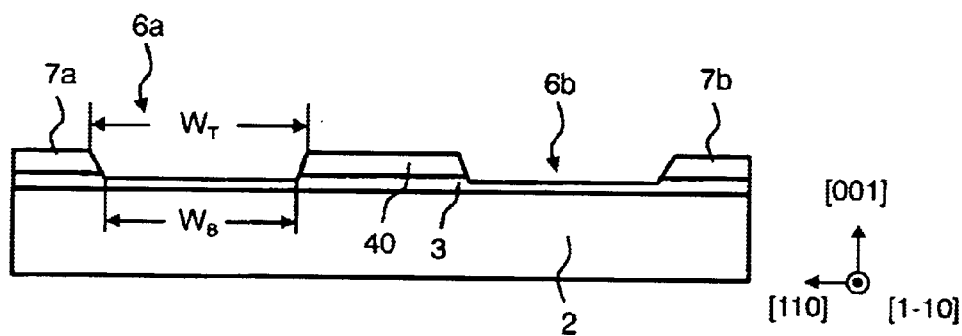
FIG. 4(B) is a cross sectional view along I—I in FIG. 4(A)
Figure 4C:
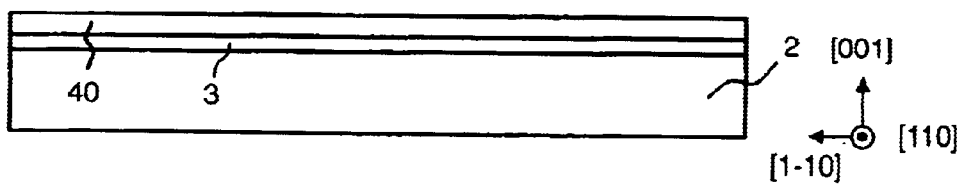
FIG. 4(C) is a cross sectional view along II—II in FIG. 4(A)

An etching mask 5 with a photo resist 4 is formed on the sub-collector film 4 (FIG. 3(A)~FIG. 3(C)). The mask 5 has two openings (5a, 5b) expanding along [1–10] and width along [110] of openings are about 1.6 um. The sub-collector film 4 is etched by this mask 5 with a solution of sulfuric acid ($H_2SO_4$): hydrogen peroxide ($H_2O_2$): water ($H_2O$)= 1:1:500. This etching forms two depressions (6a, 6b) on the sub-collector film 4 and the sub-collector layer 40 is formed between two depressions. The edges along [1–10] of the sub-collector layer 40 shapes a normal mesa, thus the cross section of the sub-collector layer 40 is a trapezium. The width $W_T$ of the opening at the top thereof is about 1.6 um and that $W_B$ at the bottom is about 0.8 um, respectively.

Second Epitaxial Growth

Figure 5A:
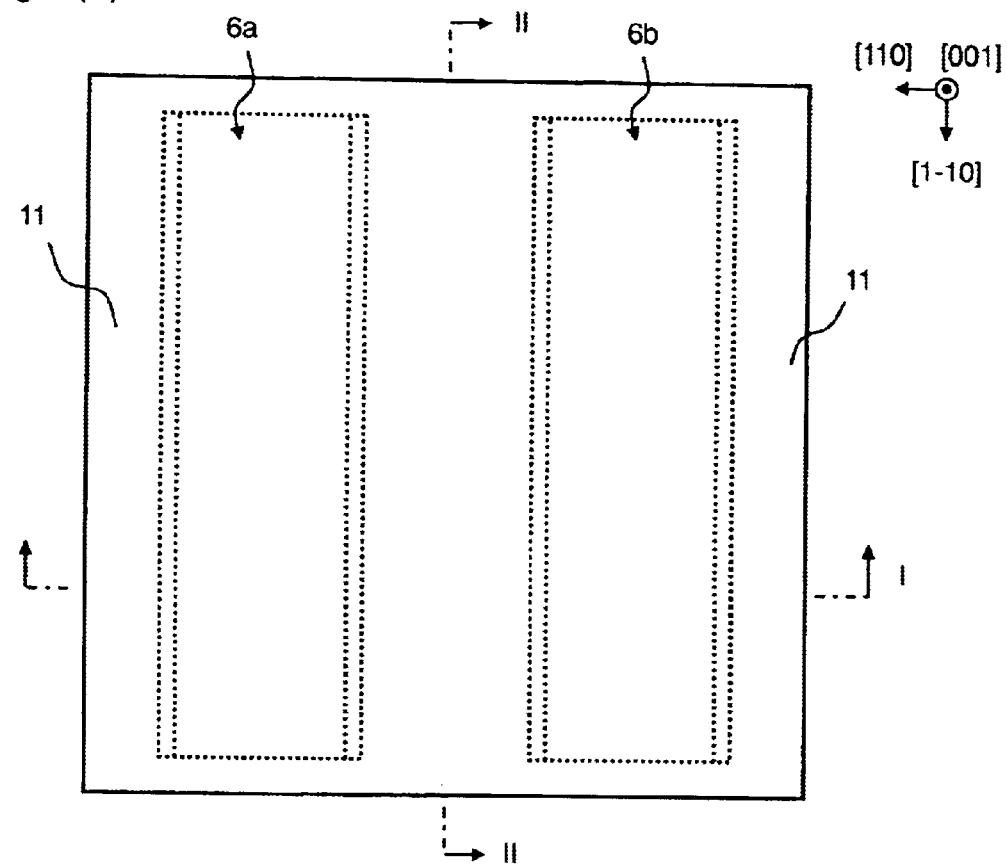
FIG. 5(A) is a plane view of the HBT at an intermediate step next to FIG. 4.
Figure 5B:
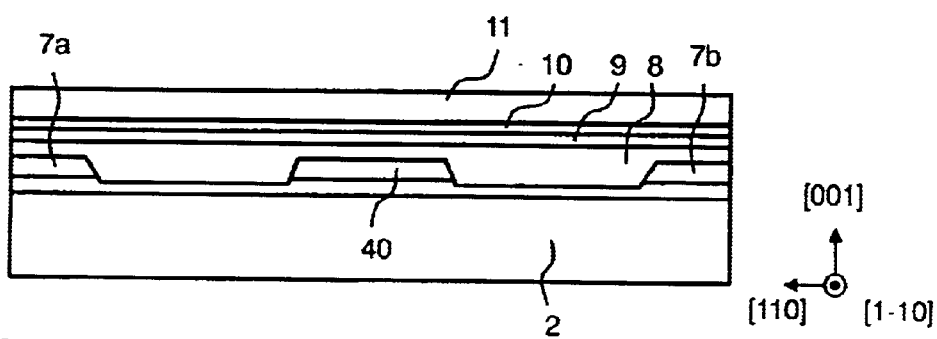
FIG. 5(B) is a cross sectional view along I—I in FIG. 5(A)
Figure 5C:
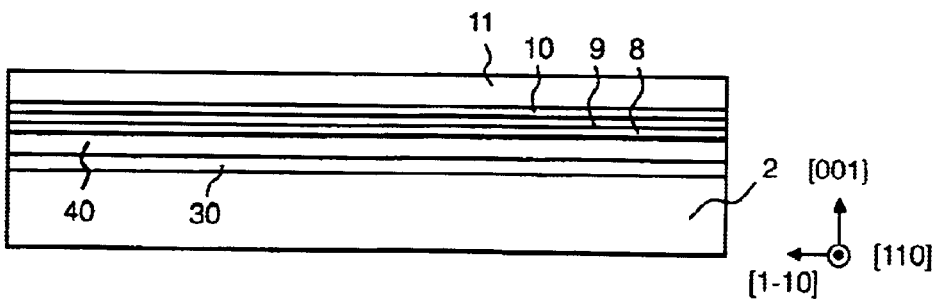
FIG. 5(C) is a cross sectional view along II—II in FIG. 5(A)
Figure 6A:
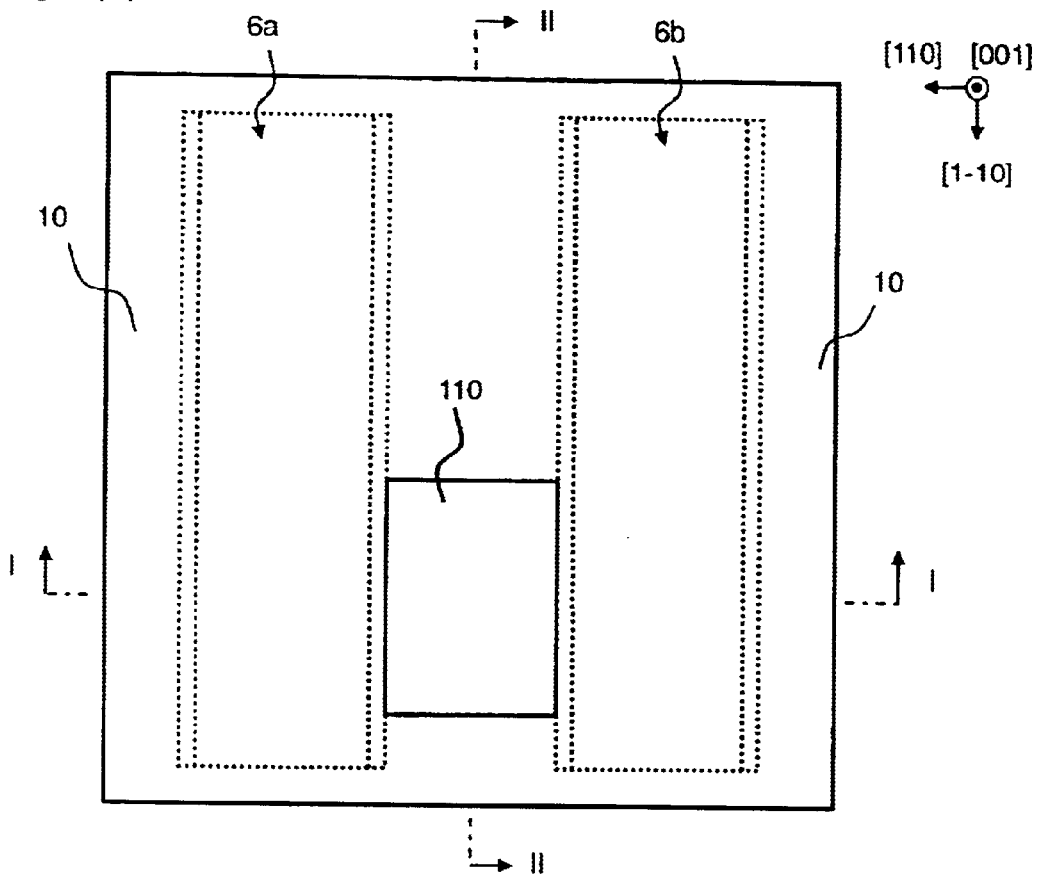
FIG. 6(A) is a plane view of the HBT at an intermediate step next to FIG. 5.
Figure 6B:
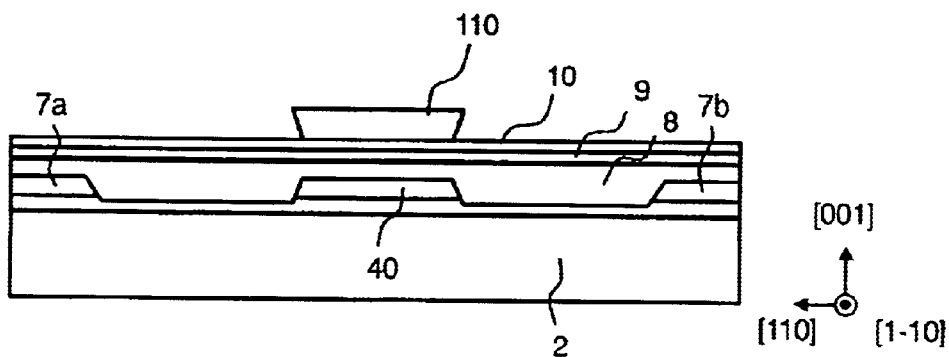
FIG. 6(B) is a cross sectional view along I—I in FIG. 6(A)
Figure 6C:
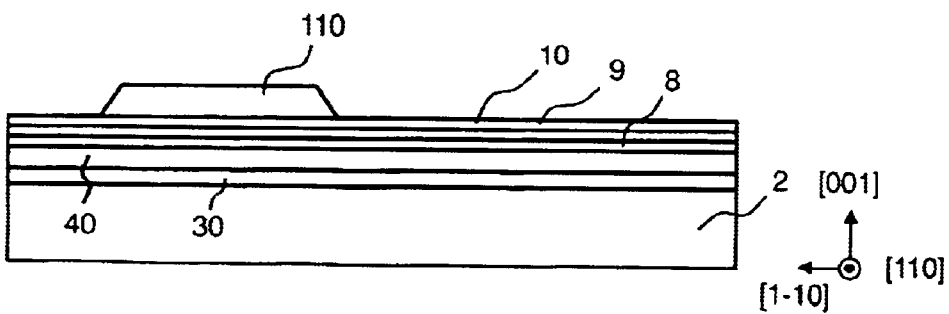
FIG. 6(C) is a cross sectional view along II—II in FIG. 6(A)
Figure 7A:
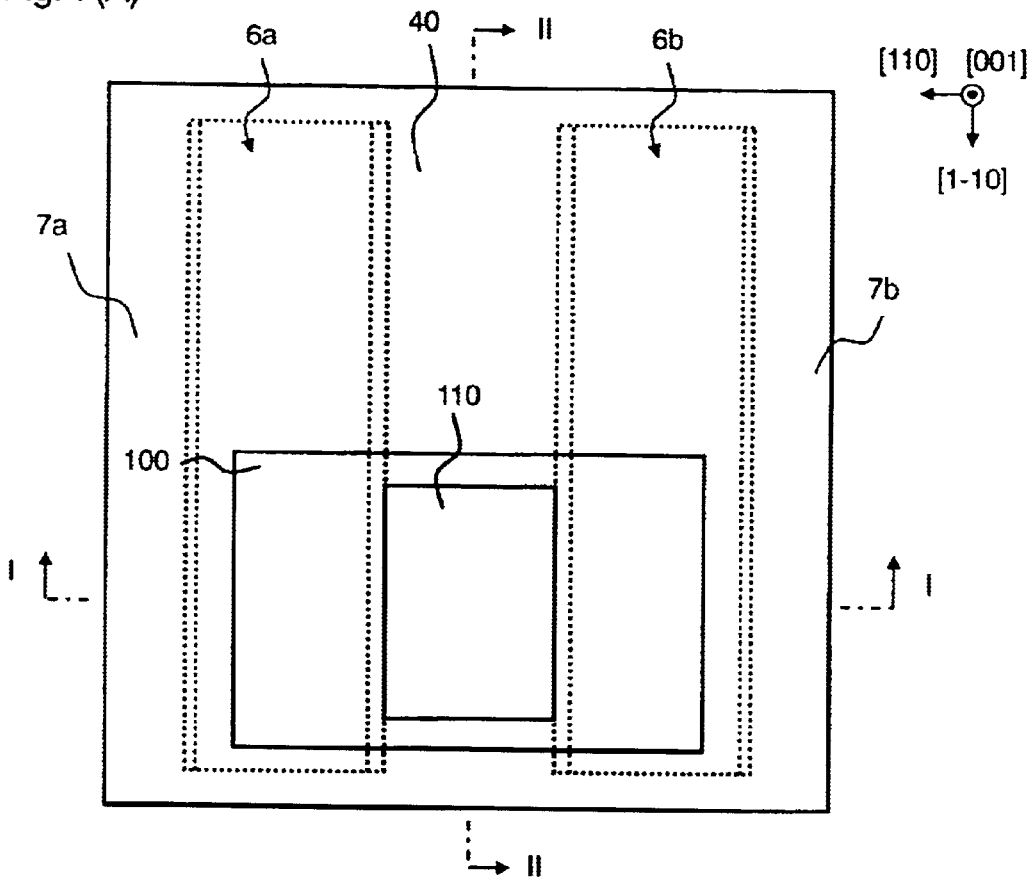
FIG. 7(A) is a plane view of the HBT at an intermediate step next to FIG. 6.
Figure 7B:
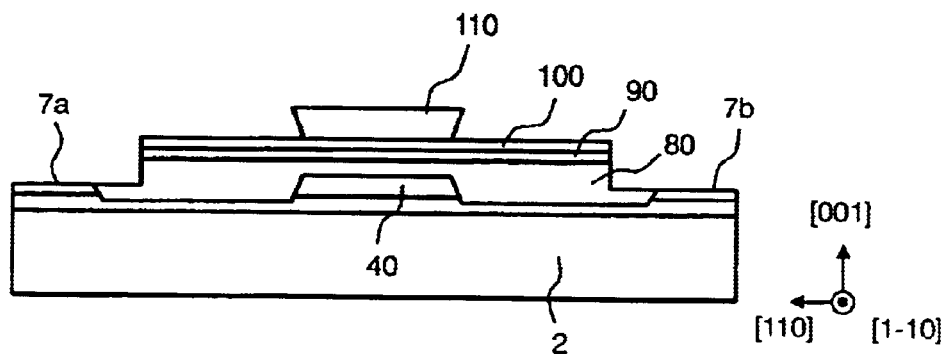
FIG. 7(B) is a cross sectional view along I—I in FIG. 7(A)
Figure 7C:
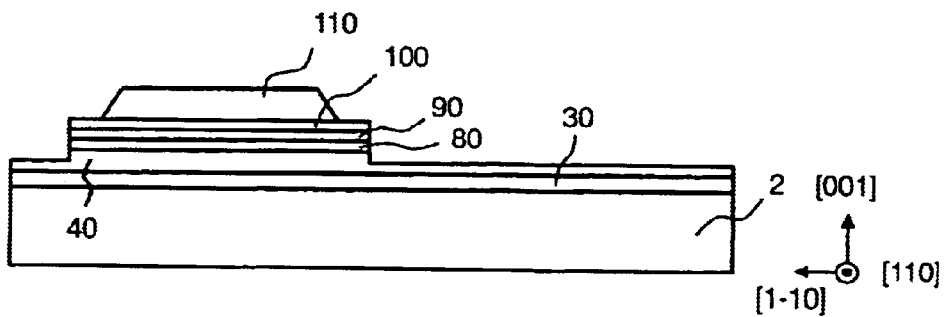
FIG. 7(C) is a cross sectional view along II—II in FIG. 7(A)
Figure 8A:
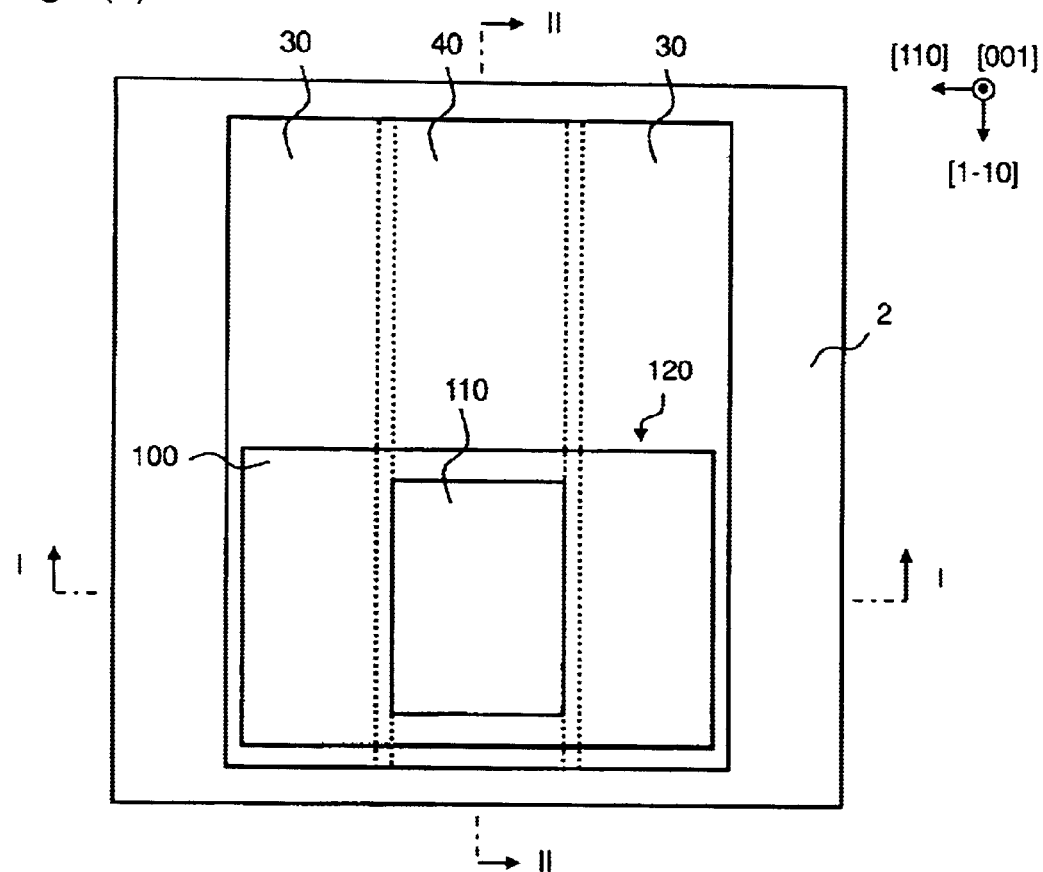
FIG. 8(A) is a plane view of the HBT at an intermediate step next to FIG. 7.
Figure 8B:
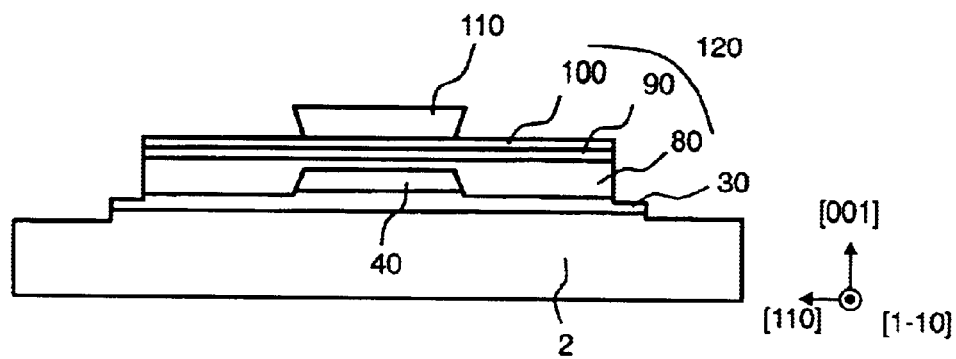
FIG. 8(B) is a cross sectional view along I—I in FIG. 8(A)
Figure 8C:
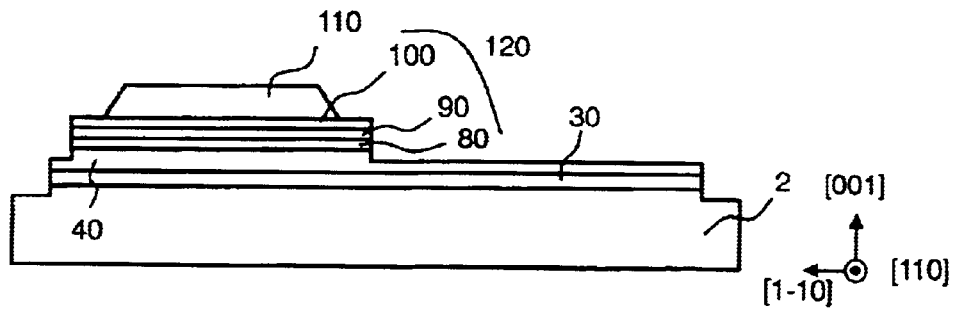
FIG. 8(C) is a cross sectional view along II—II in FIG. 8(A)
Figure 9A:
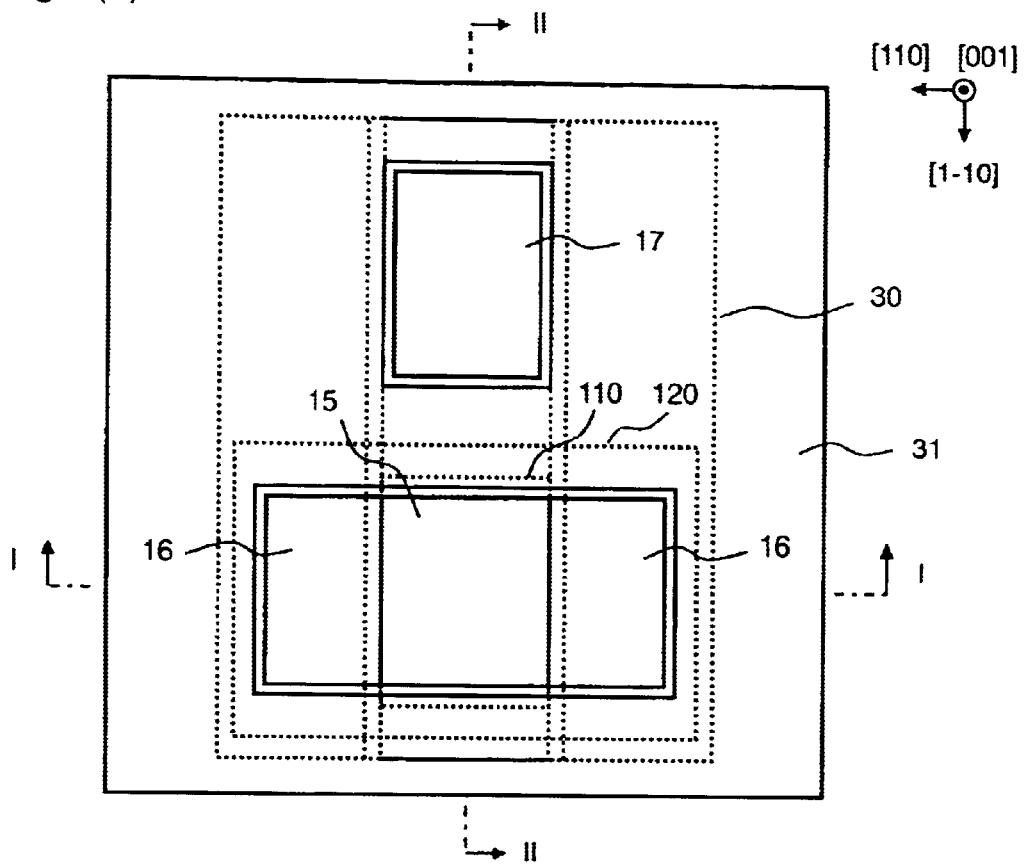
FIG. 9(A) is a plane view of the HBT at an intermediate step next to FIG. 8.
Figure 9B:
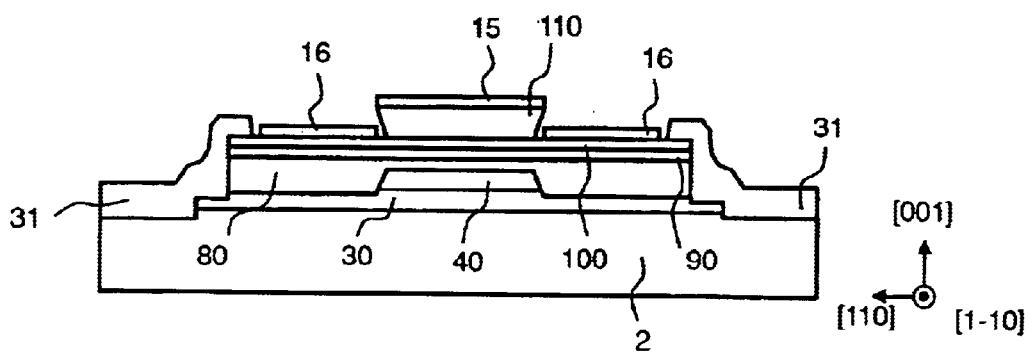
FIG. 9(B) is a cross sectional view along I—I in FIG. 9(A)
Figure 9C:
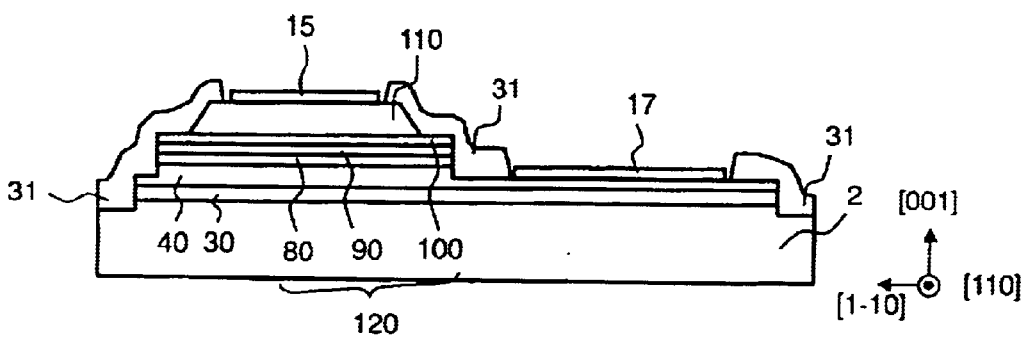
FIG. 9(C) is a cross sectional view along II—II in FIG. 9(A)

Next, the collector file 8, the base film 9, the emitter film 10 and the emitter contact film 11 are successively grown on the InP substrate 2. Films from the base 9 to the emitter contact 11 are contained respective dopant with predetermined concentration, which results on the electron or the hole concentration. The collector film is made of un-doped InGaAs. As shown in FIG. 5(B), the collector film 8 has the flat top surface because depressions formed in the sub-collector film are filled with InGaAs of the collector film 8. The base film 9, the emitter film 10 and the emitter contact film 11 also have flat top surfaces. The flatness of the top surface of the collector film 8 depends on the width of depressions in the cub-collector film 7. Between 1.0 um and 2.5 um are preferable for the width of the opening $W_T$. Below 1.0 um makes projections on depressions and Over 2.5 um results on undulations. Further, the bottom width $W_B$ of depressions is preferable to be greater than 0.5 um and smaller than 2.0 um. In the growth of the emitter contact film, the quantity of silane supply is increased, which divides the emitter contact film into the lower portion with the electron concentration about $1.0\times10^{18}$ [$cm^{-3}$] and the upper portion with the concentration about $2.0\times10^{19}$ [$cm^{-3}$].

Formation of Emitter Contact Layer

The mask with a predetermined coverage is formed on the emitter contact film 11. Etching by using a solution of the sulfuric acid, the hydrogen peroxide and the water forms the emitter contact layer 110. The emitter film 10 shows a function of etch-stopping layer because the etching of InP by this solution is by far smaller than InGaAs. Once exposed the emitter film made of InP, the etching substantially stops. The cross sectional shape of the emitter contact layer shows a reverse trapezium along [1–10] and a normal one along [110] (FIG. 6(A) to FIG. 6(C)).

Primary Mesa Formation Step

After the formation of the emitter contact layer 110, another mask is formed so as to cover the primary portion of the device, which contains the emitter contact layer, the emitter layer, the base layer and the collector layer. This mask has a rectangle shape, one edge is along [110] and the other edge is along [1–10]. The etching for forming the primary mesa is similar to that for the device isolation. Namely, the process comprises the first etching for the InP emitter by the hydrochloric acid solution and the second etching for the other layer by the sulfuric acid solution, which forms the base layer 90, the collector layer 80. The second etching is preferable to remove a portion of the sub-collector layer over 100 nm to expose the layer inevitably. Thus, the primary mesa 120 of the collector layer 80, the base layer 90 and the emitter layer 100 are formed (FIG. 7(A) to FIG. 7(C)).

Device Isolation Process

After the primary mesa formation, another mask for the device isolation covers an area where the HBT is formed. Tow step etching is performed. First, a mixture of the hydrochloric acid and the water removes an area not covered by the mask. Since this solution can not etch InGaAs, the etching completely stops at the exposing of InGaAs base film. Secondly, another solution of the sulfuric acid, the hydrogen peroxide, and the water etches the area the base film 9, the collector film 8, and the buffer film 3, they are not covered by the mask and the just etched InP emitter layer. This second etching isolates respective HBT devices (FIG. 8(A) to FIG. 8(C)).

Formation of Electrodes

Electrodes of the base, and the emitter are formed as follows by a self-alignment process: First, an insulating film of SiN is deposited on the InP substrate 2, which covers the whole primary mesa 120. An etching mask if formed on the SiN film by a chemical vapor deposition (CVD) technique. The mask has openings on the emitter layer 100 and on the emitter contact layer 110. The reactive ion etching (RIE) removes SiN film within openings and exposes the surface of the emitter layer 100 and the emitter contact layer 110. A combination of metals, such as platinum (Pt), titanium (Ti), platinum (Pt) and gold (Au) are successively deposited in openings. Portions just aside the emitter contact layer 110 on the emitter layer 100, which are hidden by eaves of the emitter contact layer 110 along [1–10], are escaped from the deposition of metals. This divides the emitter electrode on the emitter contact layer 110 and the base electrode on the emitter layer 100. This self-alignment process enables to shorten the pass from the base electrode to the emitter electrode through the base layer, which reduces the base resistance of the HBT and enhances the high frequency performance of the device. The lift-off process removes surplus metals on the mask. Namely, metals on the resist mask are lifted off with removing the resist by a solvent. A thermal treatment under the condition of 400° C. and 1 minute in an inactive atmosphere makes the emitter electrode 15 and the base electrode 16 with an ohmic characteristic to respective semiconductor layers. The similar process forms the collector electrode 17 with the emitter and the base electrode formation (FIG. 9(A) to FIG. 9(C)).

Wiring Process

Finally, wiring for respective electrodes are formed. Another insulating film made of SiN is deposited so as to cover all electrodes and the primary mesa of the HBT. A resist mask is formed on the SiN film, which has openings corresponding to via holes on respective electrodes. After etching the SiN film on electrodes by RIE technique and removing the resist, three-layered film of resist/SiO$_2$/resist is formed on the SiN film again, which has openings so as to include openings just etched and regions corresponds to their respective wiring. Wiring metal, such as aluminum, is deposited within openings and on the three-layered film, and removing surplus metals on the three-layered film forms wiring for respective electrode. The wiring contacts to electrodes through via holes. The similar process performs wiring for the emitter electrode with that for the base and the collector electrode depicted above. Thus, HBT shown in FIG. 1(A) to FIG. 1(C) is competed.

Second Embodiment

Figure 10A:
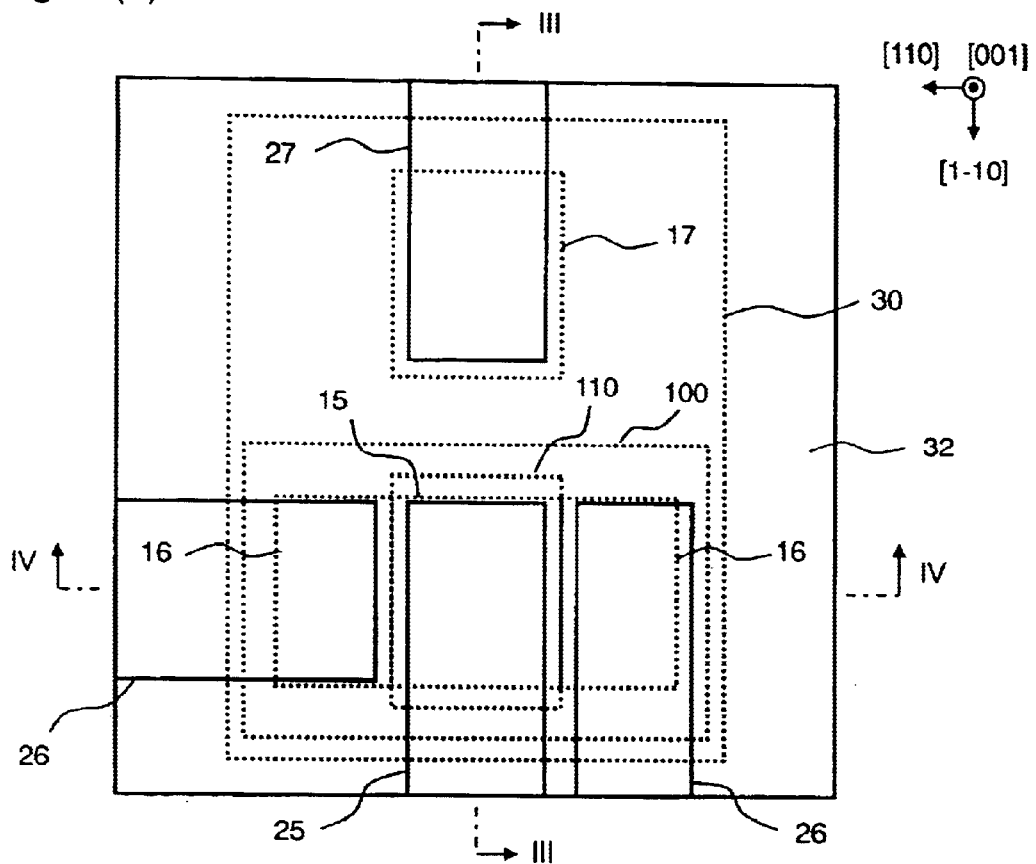
FIG. 10(A) is a plane view of the HBT according to the second embodiment of the present invention.
Figure 10B:
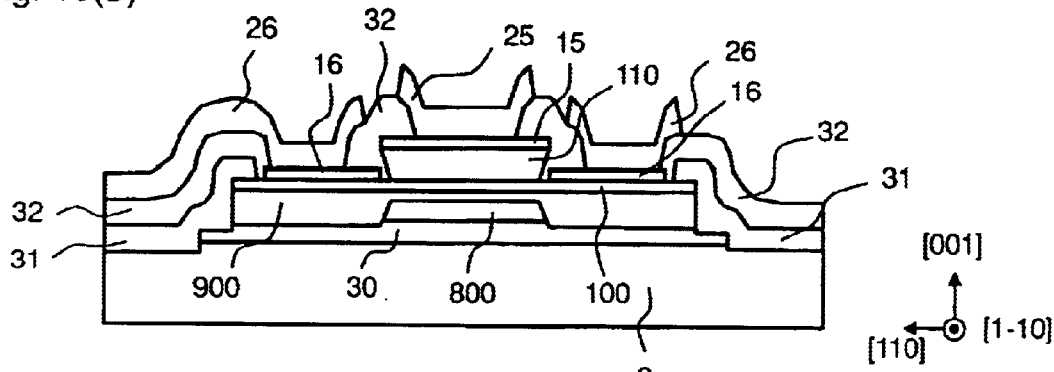
FIG. 10(B) is a cross sectional view along III—III in FIG. 10(A)
Figure 10C:
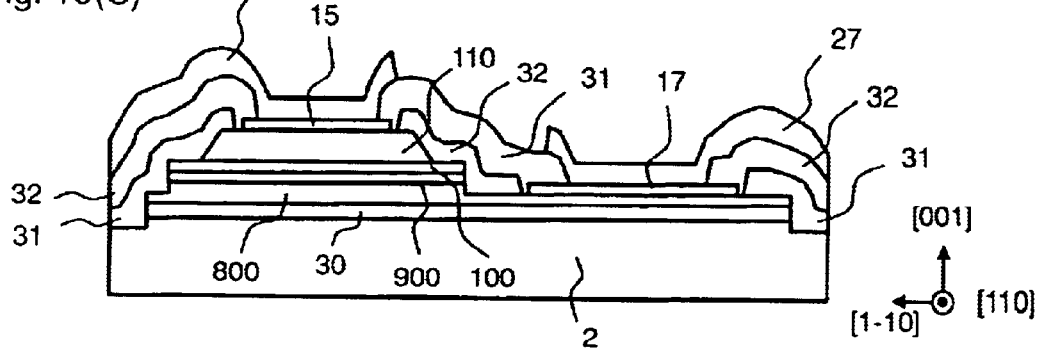
FIG. 10(C) is a cross sectional view along IV—IV in FIG. 10(A)

The HBT of the second embodiment has almost similar configuration with the first embodiment except that the HBT has not the sub-collector layer. FIG. 10(A) is a plane view of the HBT according to the second embodiment. FIG. 10(B) is a cross sectional view along III—III line and FIG. 10(C) is a cross sectional view along IV—IV line. The HBT 200 comprises the semi-insulating InP substrate 2, the buffer layer 30, the collector layer 800, the base layer 900, the emitter layer 100, and the emitter contact layer 110. The collector layer 800 is n-type InGaAs with 400 nm thickness and has the electron concentration of $1.0\sim10.0\times10^{18}$ [cm$^{-3}$] by Si doping. The plane shape of the collector layer is a rectangle, one edge is along [1–10] and the other edge is along [110].

The base layer 900 is p-type InGaAs that covers the mesa-shaped collector layer 800. The top surface of the base layer 900 is a flat surface. The thickness of the layer is about 100 nm on the collector 800, while that is about 500 nm on the buffer layer 30. The width of the emitter layer 100 along [110] is wider than the collector layer 800. Other configurations, such as the composition of Indium in the emitter contact layer and the buffer layer, and the carrier concentration of the emitter contact layer, are same as that of the first embodiment but not restricted to those values.

The HBT 200 has the collector electrode on the collector layer 800, which is peculiar to the second embodiment. Wiring to respective electrodes and the insulating film of SiN are also same as case of the first embodiment.

Next describes the manufacturing method of the HBT 200. First, the buffer film and the collector film are grown on (001) surface of the InP substrate. Two depressions are formed in the collector film by etching described in the first embodiment. The shape and dimensions of depressions are same as those (6a, 6b) formed in the first embodiment. Regions between depressions operate as the collector layer 800. After etching of depressions, the base film, the emitter film and the emitter contact film are successively grown on the substrate so as to cover depressions. Since the flatness of the surface of the base film depends on the thickness of subsequently grown film as shown in the first embodiment, it is required to adjust the width of the depression.

Next, the emitter contact film is etched by a solution of phosphoric acid and hydrogen peroxide using an etching mask to form the emitter contact layer 110. The plane shape of the emitter contact layer is rectangle with longer edge extending along [1–10], the cross section of which shows the reverse trapezium. After the formation of the emitter contact layer 110, a serious of manufacturing process follows, such as the device isolation, the primary mesa formation, electrodes formation, and the wiring formation. Finally, the HBT 200 of the second embodiment is completed.

As described before, the thickness of the base layer 900 is about 100 nm on the collector layer 800, while it is about 500 nm on the buffer layer 30. This means that the cross section of the pass where the base current flows becomes large, which reduces the base resistance and enhances the high frequency performance of the HBT.

From the invention thus described, it will be obvious that the invention may be varied in many ways. The composition of InGaAs is selected so as to match the lattice constant of the material to that of the InP. Where the lattice matching means the difference of the lattice constant between two materials is within±0.1%. Further, undoped means that the intentional doping has not fulfilled. Although embodiments depicts the combination of the InP substrate and the InGaAs layer for the collector, the base layer, the subject of the present invention is applicable to the combination of the GaAs substrate and the AlGaAs layers, and also the combination of the GaAs substrate ant the InGaP layers. Moreover, though embodiments depict the specific solution for the formation of depressions in the sub-collector film, another solution is usable if only the solution makes the depression so as that the bottom is smaller than the opening of it.

Such variations are not to be regarded as a departure from the spirit and scope of the invention, and all such modifications as would be obvious to one skilled in the art are intended for inclusion within the scope of the following claims.

We claim:

1. A bipolar transistor on a semiconductor comprising:
    a sub-collector layer formed on the substrate, the sub-collector layer having a pair of edges extending along a predetermined axis of the substrate;
    a collector layer on the sub-collector layer, the collector layer overlapping the pair of edges of the sub-collector layer and having a first gap energy;
    a base layer having a second band gap energy on the collector layer;
    an emitter layer having a third band gap energy on the base layer, the emitter layer having a top surface exposed thereof and a first pair of edges; and
    an emitter contact layer on the emitter layer, the emitter contact layer having a second pair of edges apart from the first pair of edges of the emitter layer,
    wherein the top surface of the emitter layer is planar.

2. The bipolar transistor according to claim 1, wherein the second band gap energy of the base layer is smaller than the third band gap energy of the emitter layer.

3. The bipolar transistor according to claim 1, wherein the second band gap energy of the base layer is smaller than the first band gap energy of the collector layer.

4. The bipolar transistor according to claim 2, wherein the substrate is made of InP, the sub-collector layer is made of InGaAs lattice matched to the substrate, the collector layer is made of InGaAs lattice matched to the substrate, the base layer is made of InGaAs lattice matched to the substrate and the emitter layer is made of InP.

5. The bipolar transistor according to claim 1, further comprising
    a collector electrode on the sub-collector layer;
    a base electrode on the emitter layer; and
    an emitter electrode on the emitter contact layer,
    wherein the emitter contact layer has a first portion having a first carrier concentration and a second portion having a second carrier concentration, the first portion contacting the emitter layer and the second portion being formed on the first portion, the emitter electrode being formed on the second portion.

6. The bipolar transistor according to claim 5, wherein the second carrier concentration is greater than the first carrier concentration.

7. A bipolar transistor on a semiconductor substrate, comprising
    a collector layer formed on the substrate, the collector layer having a pair of edges extending along a predetermined axis of the substrate and a first band gap energy;
    a base layer on the collector layer, the base layer overlapping the pair of edges of the collector layer and having a second band gap energy;
    an emitter layer having a third band gap energy on the base layer, the emitter layer having a top surface exposed thereof and a first pair of edges;
    an emitter contact layer on the emitter layer, the emitter contact layer having a second pair of edges apart from the first pair of edges of the emitter layer,
    a collector electrode on the collector layer;
    a base electrode on the emitter layer; and
    an emitter electrode on the emitter contact layer,
    wherein the emitter contact layer has a first portion having a first carrier concentration and a second portion having a second carrier concentration, the first portion making contact with the emitter layer and the second portion being formed on the first portion, the emitter electrode being formed on the second portion, and
    wherein the top surface of the emitter layer is planar.

8. The bipolar transistor according to claim 7, wherein the second band gap energy of the base layer is smaller than the third band gap energy of the emitter layer.

9. The bipolar transistor according to claim 7, wherein the second band gap energy of the base layer is smaller than the first band gap energy of the collector layer.

10. The bipolar transistor according to claim 8, wherein the substrate is made of InP, the collector layer is made of InGaAs lattice matched to the substrate, the base layer is made of InGaAs lattice matched to the substrate and the emitter layer is made of InP.

11. The bipolar transistor according to the claim 7, wherein the second carrier concentration is greater than the first carrier concentration.

* * * * *